United States Patent [19]

West

[11] 4,258,332
[45] Mar. 24, 1981

[54] LOUDSPEAKER AMPLIFIER

[75] Inventor: Henry W. West, Red Bank, N.J.

[73] Assignee: Wheelock Signals, Inc., Long Branch, N.J.

[21] Appl. No.: 24,999

[22] Filed: Mar. 29, 1979

Related U.S. Application Data

[62] Division of Ser. No. 732,667, Oct. 15, 1976, abandoned.

[51] Int. Cl.³ .............................................. H03F 3/04
[52] U.S. Cl. .................................. 330/297; 179/1 A
[58] Field of Search ............... 330/199, 200, 202, 297; 179/1 A, 81 B

[56] References Cited

U.S. PATENT DOCUMENTS

| | | | |
|---|---|---|---|
| 2,762,867 | 9/1956 | Meacham | 179/81 B |
| 2,842,623 | 7/1958 | Lehr | 330/297 X |
| 3,072,858 | 1/1963 | Siskind | 330/2 |
| 3,147,345 | 9/1964 | Busala et al. | 179/81 B |
| 3,161,731 | 12/1964 | Seeley | 340/409 |
| 3,309,685 | 3/1967 | Manning | 340/213 |
| 3,311,831 | 3/1967 | Leppert | 325/178 |
| 3,373,367 | 3/1968 | Clarke | 330/2 |
| 3,448,447 | 6/1969 | Tetherow | 340/409 |
| 3,531,594 | 9/1970 | Dickerson | 179/81 B X |
| 3,569,964 | 3/1971 | Mande | 340/409 |
| 3,611,362 | 10/1971 | Scott | 340/409 |
| 3,618,081 | 11/1971 | Morrow | 340/409 |
| 3,656,158 | 4/1972 | Goodwater | 340/409 |
| 3,711,854 | 1/1973 | Reynolds et al. | 340/409 |
| 3,823,273 | 7/1974 | Beenan et al. | 179/81 B |
| 3,906,491 | 9/1975 | Gosswiller et al. | 340/409 |
| 3,912,883 | 10/1975 | Goodyear | 179/175.3 R |
| 3,936,821 | 2/1976 | Cooper et al. | 340/409 |
| 3,989,908 | 11/1976 | Budrys et al. | 179/175.1 A |
| 4,024,360 | 5/1977 | Biraghi et al. | 179/175.3 R |

FOREIGN PATENT DOCUMENTS

| | | | |
|---|---|---|---|
| 846978 | 7/1970 | Canada | 340/151 |
| 803396 | 10/1958 | United Kingdom | 330/297 |
| 917509 | 2/1963 | United Kingdom | 179/81 B |

OTHER PUBLICATIONS

Nema Training Manual for Local Fire Protective Signalling Systems, Nema Pub., No. SB4–1971, ©1971.

Primary Examiner—James B. Mullins
Attorney, Agent, or Firm—Brumbaugh, Graves, Donohue & Raymond

[57] ABSTRACT

An automatic audible signaling system for use in emergency warning and direction of people in the evacuation of buildings and the like comprises control apparatus at a central station, a plurality of local amplifiers mounted at remote locations, and at least one loudspeaker connected to each amplifier. The control apparatus comprises an audio preamplifier and, coupled to the output thereof, a modulation transformer having a center-tapped secondary to which a DC voltage is applied when it is desired to operate the loudspeakers. This arrangement supplies mixed DC power and low-level audio signal voltage to each of the remote amplifiers and obviates both the use of a high-power amplifier at the central station and the transmission of a high-power audio signal from the central control apparatus to the remote loudspeakers. The system also comprises supervisory means including a differential amplifier that normally produces no output but that, in response to a malfunction of the system, operates a relay that gives a trouble indication. The local amplifiers are specially designed to respond to the mixed AC/DC signal and to facilitate line supervision.

4 Claims, 5 Drawing Figures

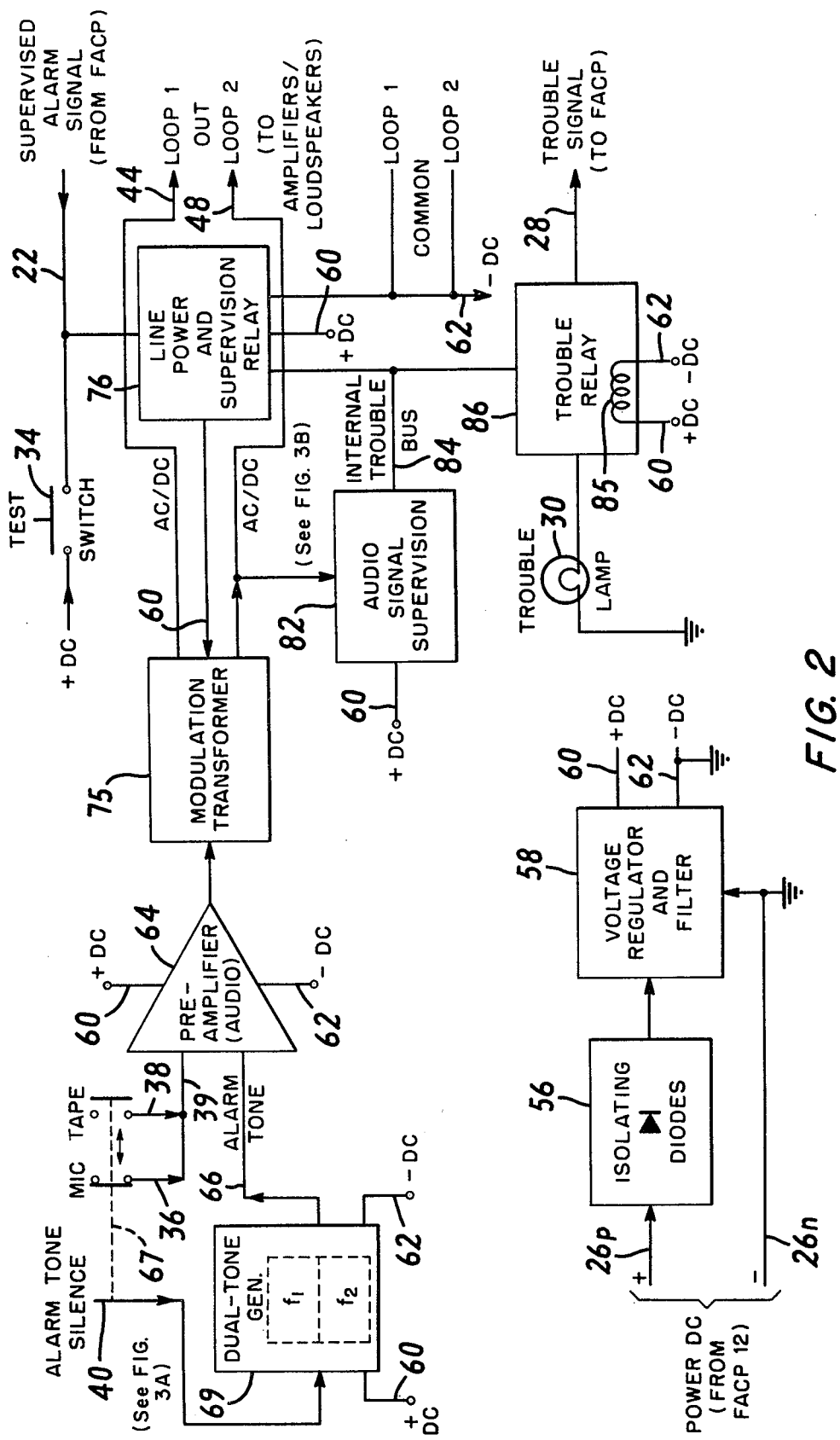
FIG. 2 (CONTROL/INTERFACE UNIT)

LOUDSPEAKER AMPLIFIER

This is a division, of application Ser. No. 732,667, filed Oct. 15, 1976, now abandoned.

BACKGROUND OF THE INVENTION

This invention relates to an automatic audible signaling system and, more particularly, to such a system for use in emergency warning and direction of people in the evacuation of buildings and the like.

A number of fire-alarm systems and other automatic systems designed to activate electromechanical audible signaling devices such as bells and horns and to provide the capability of giving voice instructions by means of loudspeakers mounted in strategic locations throughout a building are known. However, conventional systems have the serious drawback that, in order to power a number of local loudspeakers mounted at remote locations, it is necessary to employ, at a central control station, an expensive, high-power amplifier. Usually, in fact, two such amplifiers are required, the second to serve as a back-up in case of failure of the main amplifier. The audio signal developed by whichever amplifier is in service must be transmitted over a considerable distance to the various speakers. Since the audio signal is a signal of high power, shock and fire hazards are presented. Moreover, the sound system must be "customized:" i.e., specially adapted to the characteristics of the fire-alarm control panel (FACP) used with it. Expensive additional control boxes and switching circuits must be devised, and, in general, a cumbersome adaptation of equipment must be made to satisfy the requirements of tone/voice capability.

A number of circuits for supervising the operation of fire-alarm systems and the like are also known. However, conventional supervisory means are comparatively complex and expensive.

SUMMARY OF THE INVENTION

An object of the invention is to remedy the problems of conventional apparatus noted above by providing a simpler and more integral adaptation of an audio amplifier system to a conventional fire-alarm control panel. In particular, an object of the invention is to obviate both the use of high-power amplifiers and the transmission of high-power audio signals from central control apparatus to remote loudspeakers in an automatic audible signaling system. Another object of the invention is to provide reliable and inexpensive supervisory means for signaling a malfunction of the audio system.

The foregoing and other objects are attained, in an automatic audible signaling system for use in emergency warning and direction of people in the evacuation of buildings and the like, by the provision of central control apparatus, a plurality of local amplifiers mounted at remote locations, and at least one loudspeaker connected to each amplifier. In accordance with the invention, novel circuit means supplies each of the amplifiers with mixed DC power and low-level audio-signal voltage.

The circuit means preferably comprises only two wires connecting each of the amplifiers to a center-tapped secondary of a transformer included in the control apparatus.

More particularly, (a) the circuit means preferably comprises a pair of wire loops, each amplifier being connected across one of the loops in parallel with the other amplifiers that are in the same loop, and (b) the control apparatus comprises (i) a transformer having a primary and a secondary, the secondary having a center tap, (ii) circuitry including preamplifier means for applying a low-level audio signal to the primary, and (iii) means for applying a DC voltage to the center tap, the opposite ends of the secondary respectively being connected to the two loops, whereby the low-level audio signal and the DC voltage are mixed and supplied to each of the loops.

A swamping resistor is preferably connected across the secondary. The swamping resistor has a resistance such that, when the load on the secondary changes in either direction between full load and no load, the load on the primary stays within the loading requirements of the preamplifier means, thereby obviating impedance matching.

In accordance with the invention, supervisory means is provided for signaling a malfunction of the audio system. The supervisory means comprises a differential amplifier and a relay connected thereto, the differential amplifier producing an output operating the relay in response to a malfunction of the audio system.

The relay comprises a relay coil, and the differential amplifier comprises two amplifiers connected in opposition to each other on opposite sides of the relay coil. The amplifiers are connected between junctions of a bridge circuit that are null points when the bridge is balanced, and the relay coil is connected between the outputs of the amplifiers. The bridge circuit becomes unbalanced in response to a malfunction of the audio system.

The relay coil has a center tap, the amplifiers normally causing substantially equal currents to flow in opposite directions through respective halves of the relay coil between the center tap and opposite ends of the relay coil, whereby the relay coil normally produces substantially no external magnetic flux. One of the amplifiers is cut off in response to an imbalance of the bridge, whereby the other amplifier causes a current to flow through one-half of the relay coil. The relay coil then produces sufficient external magnetic flux for operation of the relay.

Each local loudspeaker amplifier comprises means for receiving a mixed AC/DC signal and means for separating the AC signal from the DC signal. The amplifier is powered by the separated DC signal and modulated by the separated AC signal.

The separating means preferably comprises an inductor for passing the DC signal and blocking the AC signal and a capacitor in parallel therewith for passing the AC signal and blocking the DC signal.

An additional capacitor is moreover preferably provided in series with the inductor and ground for smoothing out any residual AC signal that might otherwise be mixed with the separated DC signal.

A diode is connected in the amplifier in such a manner that, when the DC signal is of one polarity, it is blocked by the diode and the amplifier is cut off, facilitating supervision of the speaker line circuit, and, when the DC signal is of the opposite polarity, the separated DC and AC signals are effective to operate the amplifier.

BRIEF DESCRIPTION OF THE DRAWING

An understanding of other aspects of the invention may be gained from a consideration of the following detailed description of the preferred embodiments thereof in conjunction with the appended figures of the drawing, wherein:

FIG. 2 is a schematic view in somewhat more detail of a portion (the control/interface unit or CIU) of the apparatus of FIG. 1;

DESCRIPTION OF THE PREFERRED EMBODIMENTS

General Description of the Entire System

Figure 1:
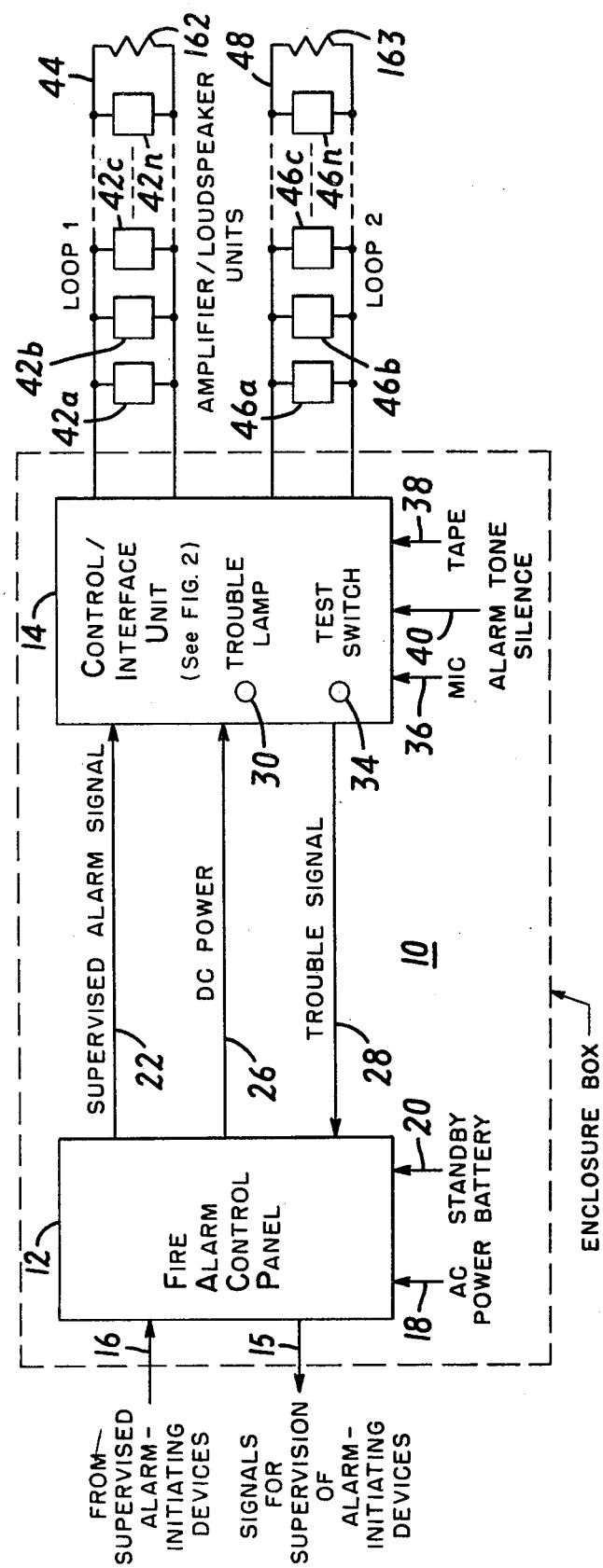
FIG. 1 is a schematic view of apparatus in accordance with the invention.

FIG. 1 shows in dotted outline an enclosure box 10 mounted at a central location such as a fire-control station of an apartment building or the like. Within the enclosure box 10 are a fire-alarm control panel or FACP 12 and a control-interface unit or CIU 14. The FACP 12 is a conventional device and may be, for example, as illustrated in the NEMA Training Manual for Local Fire Protective Signalling Systems, published jointly by National Electrical Manufacturers Association, of New York, New York, and National Joint Apprenticeship and Training Program for the Electrical Industry, of Washington, D.C. (1971). The CIU 14 is novel and described in detail below.

The FACP sends signals for supervision of alarm-initiating devices (not shown) on a line 15 and receives signals from the supervised alarm-initiating devices over a line 16. It receives AC power over a line 18, and, in case of failure of AC power, it receives DC power over a line 20 from one or more standby batteries (not shown).

The supervised alarm-initiating devices may consist of smoke detectors, heat detectors, or manual fire-alarm pull boxes or the like. In response to detection of an emergency such as smoke or fire, they send appropriate signals to the FACP 12. The FACP 12 then sends a supervised alarm signal to the CIU 14 over a line 22. The FACP 12 also provides the CIU 14 with DC power over a line 26. In case of a malfunction of the audio system, i.e., of the CIU 14 or of the apparatus it controls (described below), the CIU 14 sends a trouble signal to the FACP 12 over a line 28.

The CIU 14 includes a trouble lamp 30 and a test switch 34, and it is capable of receiving, in addition to the signals from the FACP 12 itemized above, signals from a microphone (FIG. 3A) over a line 36 and from a tape (not shown) or other auxiliary source over a line 38, and, when the microphone or auxiliary source is cut in, an alarm tone silence signal over a line 40.

The CIU 14 is connected to amplifier/loudspeaker units 42a, 42b, 42c, ... 42n by a first loop 44 and to amplifier/loudspeaker units 46a, 46b, 46c, ... 46n by a second loop 48. The various amplifier/loudspeaker units are strategically placed in an apartment building, office building, department store, armory, church, school, factory or the like in order to give immediate warning (for example, by an automatic audible alarm) and voice instruction (for example, using a microphone or a voice message prerecorded on tape) in case of an emergency such as fire.

General Description of the Control/Interface Unit

FIG. 2 shows the CIU 14 in greater detail. It receives DC power from the FACP 12 on positive line 26p and a grounded negative line 26n (the two lines are shown schematically as a single line 26 in FIG. 1). The positive line 26p passes through isolating diodes 56 to a voltage regulator and filter 58, and the negative line 26n is connected directly to the voltage regulator and filter 58. The output of the voltage regulator and filter 58 is regulated DC power supply on a positive line 60 and a grounded negative line 62.

Since the audio signal or sound power is developed locally by a separate small amplifier for each loudspeaker, the CIU 14 does not include an audio amplifier. Rather, it includes a low-power audio preamplifier means 64 that normally receives an alarm tone on a line 66 whether or not an emergency has been signaled and that, in the discretion of a fire marshal or other operator of the system, may also receive a signal from a microphone over the line 36. It may also receive, either in the operator's discretion or automatically on commend by the FACP (by means of a connection not shown), a signal from a tape (not shown) or other auxiliary signal source over the line 38. The microphone, tape source and alarm tone silence line 40 are interconnected as represented by the dotted line 67 to establish priority: switching in the microphone or auxiliary source causes generation of an alarm tone silence signal on the line 40 that silences the alarm tone so that voice instruction can be heard more easily.

The alarm tone supplied to the preamplifier 64 on the line 66 is generated by dual-tone generator 69. The signals generated by the tone generator 69 have different frequencies $f_1$ and $f_2$, both in the audio range. The frequency $f_1$ may be, say 666 Hertz, and the frequency $f_2$, say, 833 Hertz; the frequencies are thus in the ratio of 4:5. This mixture of tones produces a strident alarm sound rich in discordant beat frequencies and harmonics within the audio pass-band of the loudspeakers 42a, 42b ... 42n and 46a, 46b ... 46n. Also, the use of a dual-tone generator comprising two independent alarm-tone generators adds to the reliability of the circuit, in the event that one fails.

In the absence of a detected fire or other emergency, the electrical alarm-tone signals always present on the line 66 (except when silenced by a signal on the line 40) are not processed to operate the loudspeakers 42a ... 46n. However, in case of such emergency, the FACP sends a signal on the line 22 that causes the speakers 42a ... 46n to produce an audible alarm.

To this end, a modulation transformer 75 always receives the audio output of the preamplifier 64. It selectively receives, under the control of a line power and supervision relay circuit 76, the regulated DC positive voltage on the line 60. When the DC positive voltage is supplied to the modulation transformer, it generates a mixed AC/DC signal that is supplied to the two output loops 44 and 48. The circuit 76 is activated whenever it receives a DC positive signal on the line 22. Such a signal is generated on the line 22 either (a) by the FACP 12 only in response to an emergency signaled on the line 16 by one or more of the supervised alarm-initiating devices or (b) by closure of the test switch 34 (which is within the CIU) in order to check the circuit. The alarm signal or test signal operates a relay in the circuitry 76 and applies the DC voltage on the line 60 to the modulation transformer 75. This provides the necessary power for the speakers 42a . . . 46n so that the audio signal generated by the dual-tone generator 69 and transmitted by the modulation transformer 75 onto the loops 44 and 48 can modulate the speakers. The line 62 is a common return line for the two loops. During the alarm condition, the line 62 is the grounded negative of the regulated DC supply.

Audio signal supervision is provided by circuitry 82, which receives as inputs the output of the modulation transformer 75 and, on the line 60, the regulated DC positive voltage. The circuitry 82 generates a signal on an internal trouble bus 84 in case of loss of the audio signal output of the modulation transformer 75.

In response to such a signal, the relay coil 85 of a trouble relay circuit 86 is energized. This causes the trouble lamp 30 to light and also provides a trouble signal to the FACP on the line 28.

Detailed Description of the Control-Interface Unit

Figure 3A:
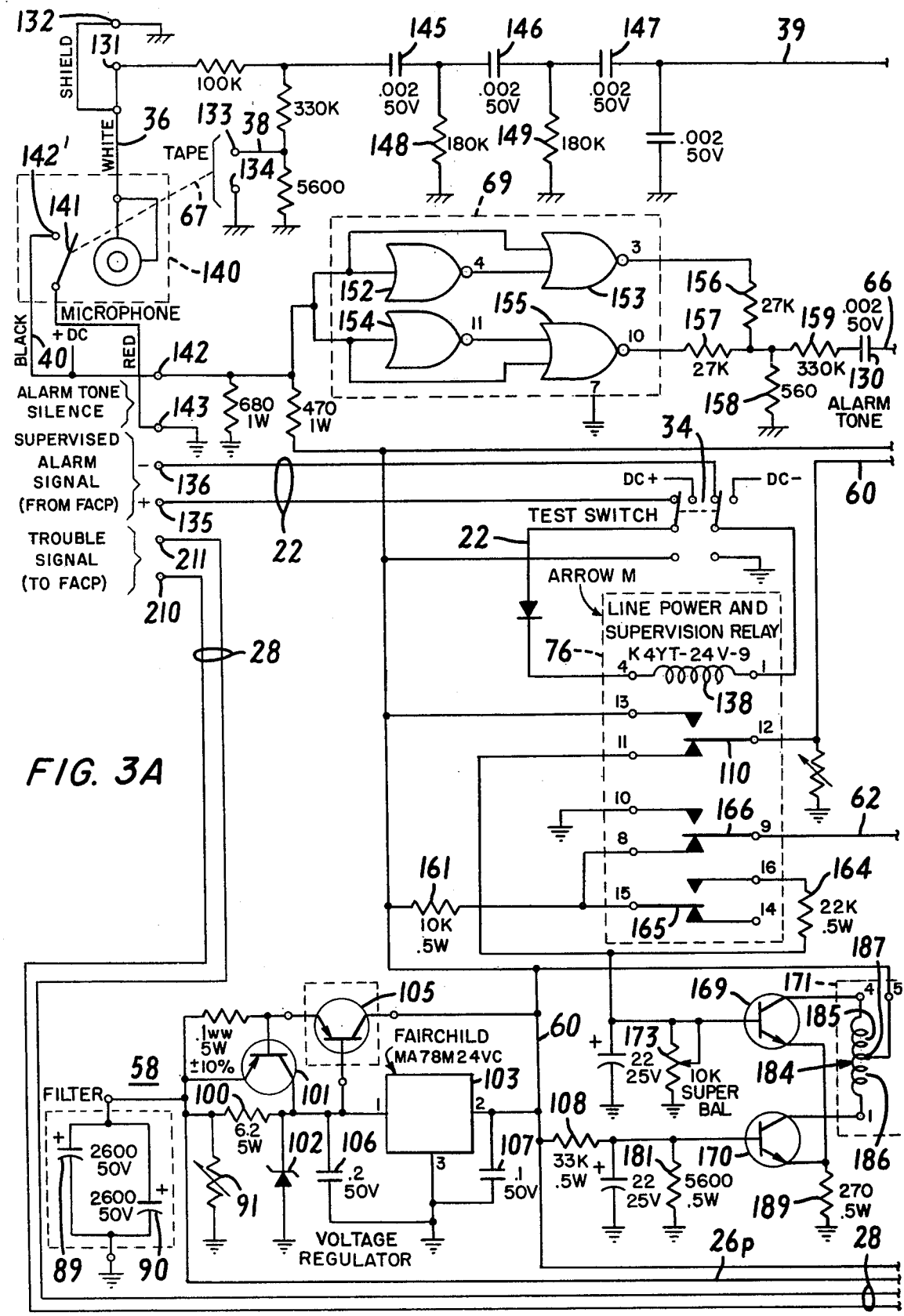
FIGS. 3A and 3B taken together are a schematic view in still more detail of the apparatus of FIG. 2 (FIGS. 3A and 3B should be arranged side by side with FIG. 3B to the right of FIG. 3A)
Figure 3B:
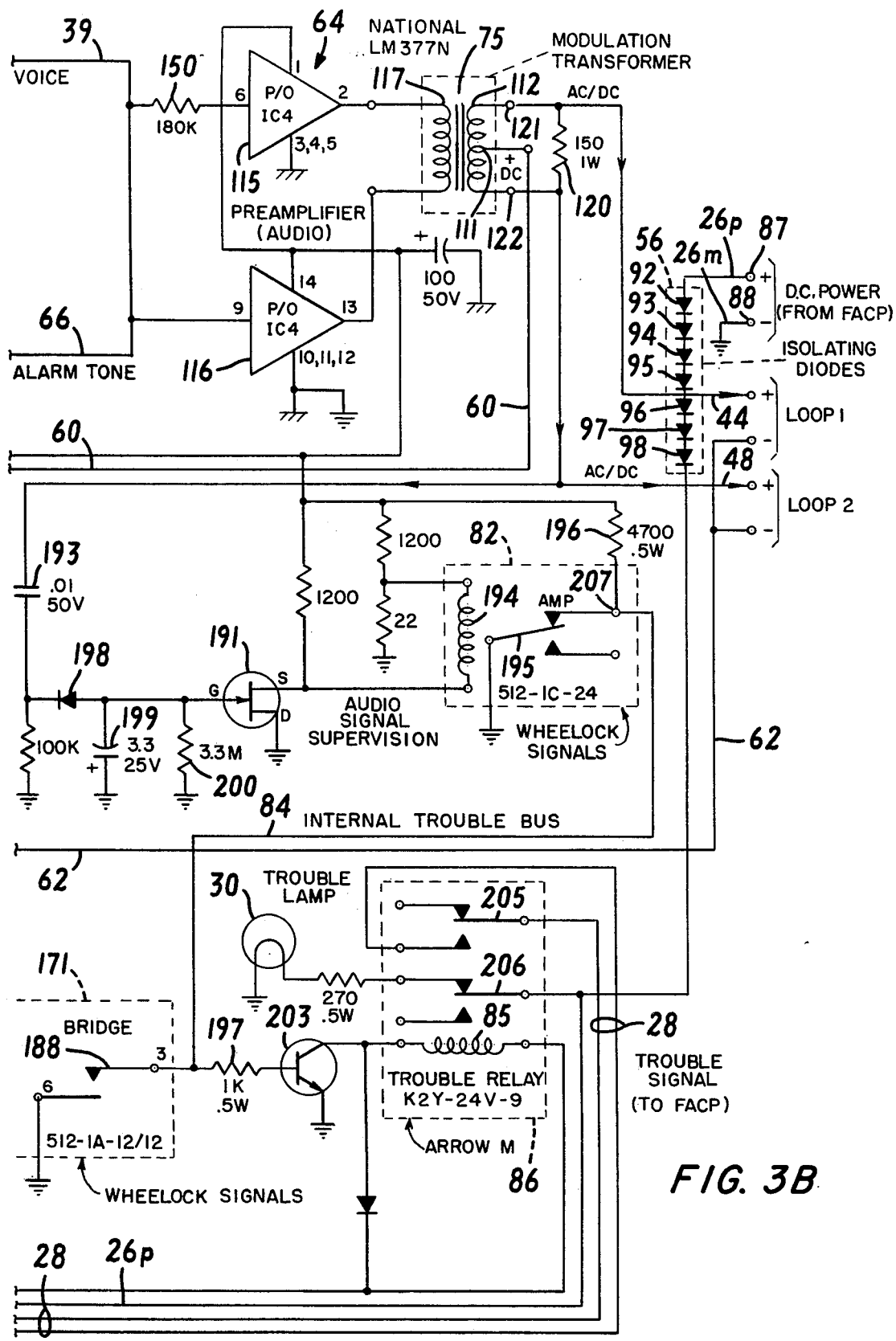

As indicated above, FIGS. 3A and 3B show the circuitry of the CIU 14 in greater detail than does FIG. 2.

The power input circuit which comprises the isolating diodes 56 (FIG. 3B) and the voltage regulator and filter 58 (FIG. 3A), is designed to operate reliably over a wide range of input voltage and despite input transients. For example, the power transformer (not shown) connected to terminals 87 and 88 is rated at a full load of, say, 24 volts rms at 10 amperes. The peak voltage is then 24 volts times 1.414=33.94 volts. However, during standby conditions with light loading current, say 0.3 amperes, there is typically 28 volts rms and around 40 volts peak. This means that, taking into account the slight voltage drop across capacitors 89 and 90, the normal range of the full-waverectified and filtered voltage is from about 33 to 39 volts DC, full load to no load. The voltage range given is based on nominal primary line voltage (115 VAC). When the line voltage on the primary side of the transformer (not shown) supplying current to the terminals 87 and 88 changes, the DC voltage follows in proportion. Moreover, noise voltage, switching transients, lightning charge, and other causes of transient circuit conditions all may appear at times on the power input lines. These considerations call for some sort of voltage regulation.

The voltage-regulating circuit starts at terminals 87 and 88 (FIG. 3B). A varistor 91 (FIG. 3A) such as type GE V60LA20 absorbs voltage transients by conducting at plus or minus 60 volts.

The diodes shown collectively at 56 preferably comprise seven series diodes 92 through 98, which serve two purposes. First, they drop the input voltage a constant 0.5 volts per diode, for a total of 3.5 volts, independently of the current; second, they isolate the regulator and filter circuit 58 from the full-wave DC supplied by the FACP 12.

Capacitors 89 and 90 constitute a ripple-voltage filter, and a resistor 100 sets the conduction threshold of a transistor 101. A zener diode 102 conducts at 38 volts and prevents excessive voltage at the input to a voltage regulator 103. The latter may be a Fairchild MA78M24VC. With normal operating voltages, the zener diode 102 does not conduct. A transistor 105 is a series voltage regulator that extends the current maximum of the voltage regulator 103. Capacitors 106 and 107 improve the transient response of the voltage regulator 103. The reliability of the system is increased by these additional protective circuits. This is especially important, since the CIU 14 is used in public safety applications.

The DC power on the output line 60 of the voltage regulator 103 is supplied through a switch 110 when the switch is in its upper position (i.e., during the alarm condition) to the center tap 111 of the seconday side 112 of the modulation transformer 75. The audio preamplifier circuit 64 is an integrated circuit device that contains two separate high-gain audio preamplifiers 115 and 116 externally connected in a standard bridge circuit that combines the power output of each amplifier and supplies this output to the primary winding 117 of the transformer 75. The transformer 75 couples the audio voltage developed across its primary winding 117 to the secondary winding 112. The audio signal voltage coupled through the transformer 75 is thus superimposed on the DC voltage applied to the center tap 111 during the alarm condition, when the switch 110 is in its upper position, and both voltages then appear on the two-wire transmission loops 44 and 48. During the supervisory condition, when the switch 110 is in its lower position, the audio voltage appears on the speaker loops as before. However, the DC voltage is applied to the loops with reverse polarity through the switch 166, which is then in its lower position. A diode 214 described later in connection with FIG. 4 prevents application of the reverse DC voltage to the loudspeaker amplifier circuits, and the loudspeakers are thus cut off. Without the DC power, the audio signal, which is on the speaker loops even during the supervisory condition, is incapable of operating the loudspeaker amplifiers.

The primary-to-secondary turns ratio $N_p/N_s$ of the transformer 75 is about 1:2. The transformer thus steps up the voltage by a factor of about 2. The secondary is permanently shunted with a hundred-ohm "swamping" resistor 120, so that, with no external load, the input primary impedance is $Z_p = Z_s[N_p/N_s]^2 = 100[\frac{1}{2}]^2 = 100 \times 0.25 = 25$ ohms. Thus, if an external load of, say, 50 ohms maximum is added, the load on the secondary is $1/100 + 1/50 = 1/R$. R thus equals 33 ohms. The primary resistance now becomes $33[0.5]^2 = 8.33$ ohms. This shows that a change in the secondary conditions from no load to full load results in a primary change from 25 to 8.33 ohms, which is well within the loading requirements of the audio preamplifier 64.

The swamping resistor 120 consumes no DC power, because the output terminals 121 and 122 of the transformer 75 are at the same DC potential (plus). Consider the effect of the 100-ohm swamping resistor 120 when a purely reactive load of, say, j50 ohms at 400 Hertz is added (this is the equivalent of 20 amplifier/loudspeakers). The parallel combination is 1/100 plus 1/j50=1/Z. Z thus equals $44.72 < -63.43°$ ohms. The series equivalent secondary load is $20+j40$ ohms. The load reflected to the primary is then 0.25 (20+j40) or (5+j10) ohms; or in terms of impedance: $Z=11.18 < -63.43°$ ohms. This the worst case, because 400 Hertz is considered the lowest frequency in the pass band of the preamplifier 64. The magnitude of this impedance is within the distortion level requirements of the preamplifier. This shows that from an open circuit line load to a 50-ohm reactive load the impedance on the primary varies from 25 ohms resistive to $11.18 < -63.4°$ ohms, or $5+j10$ ohms.

This regulatory effect of the swamping resistor 120 makes the transformer 75 act like a constant-signal-voltage source for the multiple amplifier load. It means that impedance matching is not required, because practially no signal power is furnished to the line. Therefore changing the audio output power of any or all of the remote amplifier/loudspeakers has practically no effect on the line signal voltage. Another advantage is that the effect of stray shunt capacitance on the transmission line is minimized because of the low output circuit impedance. Also, the shunt capacitive reactance of the line tends to cancel the shunt inductive reactance of the load.

In both alarm and supervisory (standby) operating modes, an internally-generated alarm tone is continuously or repetitively supplied via capacitor 130 to the signal input of the audio amplifier 64. Terminal pairs 131, 132 and 133, 134 provide connections for a microphone and an optional auxiliary signal input, respectively. The three possible input signals are not applied simultaneously, since whatever priority is required by public safety codes is established by the interconnection 67.

When a supervised alarm signal from the FACP 12 appears at terminals 135 and 136, the line power and supervision relay 76, which may be an Arrow M K4YT-24V-9 and which includes a relay coil 138, reverses the switches 110, 165 and 166 from the positions shown. This disconnects the speaker loops 44 and 48 from the supervisory circuits and applies the regulated DC voltage to the speaker line with the polarity shown, thus activating the speakers and sounding the tone alarm. As explained above, the regulated DC voltage is provided by the voltage regulator 103 and is supplied through the line 60 and switch 110 and the transformer secondary center tap 111, while the alarm tone is generated by the dual-tone generator 69 and is supplied through the coupling capacitor 130 and the preamplifier 64 to the transformer 75. When voice directions are to be given, pressing the actuating button of a microphone 140 closes a switch 141. This connects terminals 142 and 142' directly to ground ground through terminal 143 and silences the alarm tone. Voice instructions alone are then sounded (provided of course that DC power is applied to the speaker lines as explained above). Upon release of the microphone button, the alarm tone resumes, if the alarm condition still exists.

The audio signals from the microphone 140 and auxiliary signal source are conditioned by a high-pass filter comprising capacitors 145, 146 and 147 and resistors 148, 149 and 150 before application to the audio preamplifier 64. The filter attenuates frequencies lower than 400 Hertz at a rate approaching 18 dB per octave. It serves to eliminate lower voice frequencies that contribute little to intelligibility and to reduce the effect of any stray low-frequency pickup. For example, 60 Hertz hum is attenuated by 50 db.

The alarm tone circuit 69 contains NOR gates connected as two separate unsynchronized square-wave-tone generators. The gates 152 and 153 generate the tone having a frequency $f_1$, and the gates 154 and 155 generate the tone having a frequency $f_2$. The two tones are mixed in a network comprising resistors 156, 157 and 158, and then the combination is applied via an isolating resistor 159 and the coupling capacitor 130 to the audio preamplifier 64.

The line power and supervision relay 76 and associated circuitry has a sensitivity such that leakage resistance of the order of 100 K between conductors and, if the negative side of the power supply is grounded, as is usually the case, between either conductor and ground can be detected. The basic sensing circuit comprises resistor 161, end-of-line terminating resistors 162 and 163 (FIG. 1) of 44K each, which are in parallel to yield an equivalent resistance of 22K, and resistor 164. The resistor 164 is a local resistor that is switched into the circuit by a switch 165 under the control of the relay coil 138 during voice or alarm condition and substitutes for the end-of-line resistors 162 and 163, which are then in effect switched out owing to the reversal of switches 110 and 166. This applies forward bias to the speakers 42a ... 46n. The switching in of the resistor 164 maintains a balance of transistors in effect and a relay 171.

During the alarm condition, the transistors 169 and 170, resistors 161 and 164 and a resistor 173 are in series between +24 volts and ground. During line supervision, the bottom or ground side of resistor 161 is connected to what is normally the minus side 62 of the speaker line, as illustrated in FIG. 3A, and the top or opposite-ground side of resistor 173 is connected to the normally positive side of the line, through the switch 110, as also shown in FIG. 3A. This connection results in a supervising current in the line that reverse-biases a number of diodes such as 214 (FIG. 4) which are respectively in series with each of the parallel-connected amplifier/loudspeaker units 42a ... 46n. The isolating diode 214 in each remote speaker circuit is nonconducting under reverse polarity, so that supervising current flows only in the 22K end-of-line resistors 162 and 163. Resistor 161 of 10K and the end-of-line resistors 162 and 163 and 22K, when added together, form one arm of a bridge circuit. The resistor 173 is in the corresponding arm of the bridge circuit. A resistor 108, having a resistance equal to the sum of the resistance of 161 and the end-of-line resistors 162 and 163, and a resistor 181 are respectively in the other two arms of the bridge circuit.

Under normal supervision conditions, the variable resistor 173 is adjusted so that there is no voltage difference between it and the resistor 181. A differential amplifier comprising the transistors 169 and 170 is connected across the null point of the resistors 173 and 181. Both transistors 169 and 170 are normally biased to conduct.

The relay 171 has a special bifilar-wound reed relay coil 184 connected so that equal currents in each winding 185 and 186 flow in opposite directions from a center tap 187, resulting in cancellation of the external magnetic flux. The relay contacts of a switch 188 now remain in normal or unenergized condition. Short circuits and open circuits are detected as follows: If a short circuit occurs between wires on the line, the voltage on the base of the transistor 169 increases, causing the voltage across the common-emitter resistor 189 to increase enough to switch off the current in both the transistor 170 and the winding 186 of the relay coil 184. Current continues to flow through the winding 185. Thus the magnetic flux associated with the current through the winding 185 continues, the opposing flux ceases, and the external magnetic flux is sufficient to close the differential relay switch 188. This causes activation of the trouble circuits. If the line circuit opens, the base of the transistor 169 goes to ground potential, and the transistor 169 stops conducting. The current in the corresponding winding 185 of the relay coil 184 stops, and current continues to flow through the winding 186. Thus the magnetic flux associated with the current through the winding 186 continues, the opposing flux ceases, and again the switch 188 closes to activate the trouble circuits. In addition to sensing open and short circuits of the line, the circuit also detects short circuits, or leakage resistance to ground, from either wire of the audio line.

Safety codes and local regulations require that the amplifiers, tone generator, and voice and auxiliary circuits be supervised at all times. This is accomplished by sensing the presence and relative level of the alarm tone signal at the extreme output end of the preamplifier 64 as measured at the secondary 112 of the transformer 75. This constitutes a dynamic indication of proper or improper operation of the dualtone generator 69 and the preamplifier 64 and of the voice (microphone) and auxiliary (tape) circuits when switched in.

The presence of an alarm tone signal is sensed by the bridge amplifier circuit including a field-effect transistor (FET) 191 and the audio signal supervision relay 82. The latter may be a Wheelock Signals 512-1C-24. The circuit is adjusted so that, without any signal input to a capacitor 193, the bridge is balanced and the relay 82 is deenergized. A negative voltage at the gate of the FET 191 unbalances the bridge and energizes the coil 194 of the relay 82. In other words, the absence of a negative voltage on the gate of the FET 191 causes the relay 82 to drop out; the switch 195 then grounds resistors 196 and 197, causing the trouble indication.

The negative DC bias voltage is obtained by rectifying a portion of the audio voltage normally appearing at the secondary 112 of the output transformer 75. A reverse-connected diode 198 conducts only during the negative half-cycles of the signal. A capacitor 199 tends to charge to the peak signal voltage, and a resistor 200 provides a long discharge time so that, upon cessation of the signal, about 80 seconds elapses before the relay 82 drops out. The 80-second time delay prevents premature dropout during voice communications and, if alarm-tone keying is used, during intervals between the alarm tone bursts. Any instance of the simultaneous absence of an alarm tone signal, a voice signal and an auxiliary signal for more than 80 seconds results in a trouble signal. The actual delay time can of course be adjusted by selection of the RC circuit values as required by the application.

Underwriters' Laboratories and safety codes require that a malfunction of the alarm circuits be indicated promptly by audible and visual trouble signals. To this end, the base of a transistor 203 is biased positive through the resistors 196 and 197, causing the transistor 203 to conduct and energize the trouble relay 86, which may be an Arrow M K2Y-24V-9, and thus keep auxiliary switch 205 closed and the lamp switch 206 open. This is the normal, no-trouble, condition. Any direct connection of the junction 207 of resistors 196 and 197 to ground (through the switch 195) removes the forward bias on the transistor 203, causing it to switch itself off and deenergize the coil 85 of the relay 86. Switch 205 then opens, which signals the FACP through line 28 and terminals 210 and 211, and switch 206 closes and thereby turns on the trouble lamp 30. Under normal conditions, the contacts governed by the supervisory relays 82 and 171 are open. A failure in the supervised circuits results in a closure of the contacts governed by these relays, thus grounding the resistors 196 and 197 and actuating the trouble indicators.

Detailed Description of the Loudspeaker-Amplifier Circuit

Mechanically, each of the amplifier-loudspeaker units 42a . . . 46n is a combination of an audio transducer and an audio amplifier mounted on a small printed-circuit board inside a speaker housing. The unit is normally remote from the CIU.

Electrically, the DC supply and audio signal voltage are sent simultaneously by the CIU over the pair of two-wire loops 44 and 48. During the supervisory standby conditions, the polarity of the DC voltage shown at terminals 212 and 213 (FIG. 4) is reversed, and a series-connected diode 214 does not conduct, thus isolating the amplifier/loudspeaker circuits from the supervised line. When the alarm condition occurs, 24 volts DC having the polarity shown and the audio signal are both applied to the terminals 212 and 213 and to the diode 214. This forward bias causes the diode 214 to conduct and have relatively low resistance in both directions, and it allows application of the DC supply voltage and the AC audio signal to the following circuitry.

Figure 4:
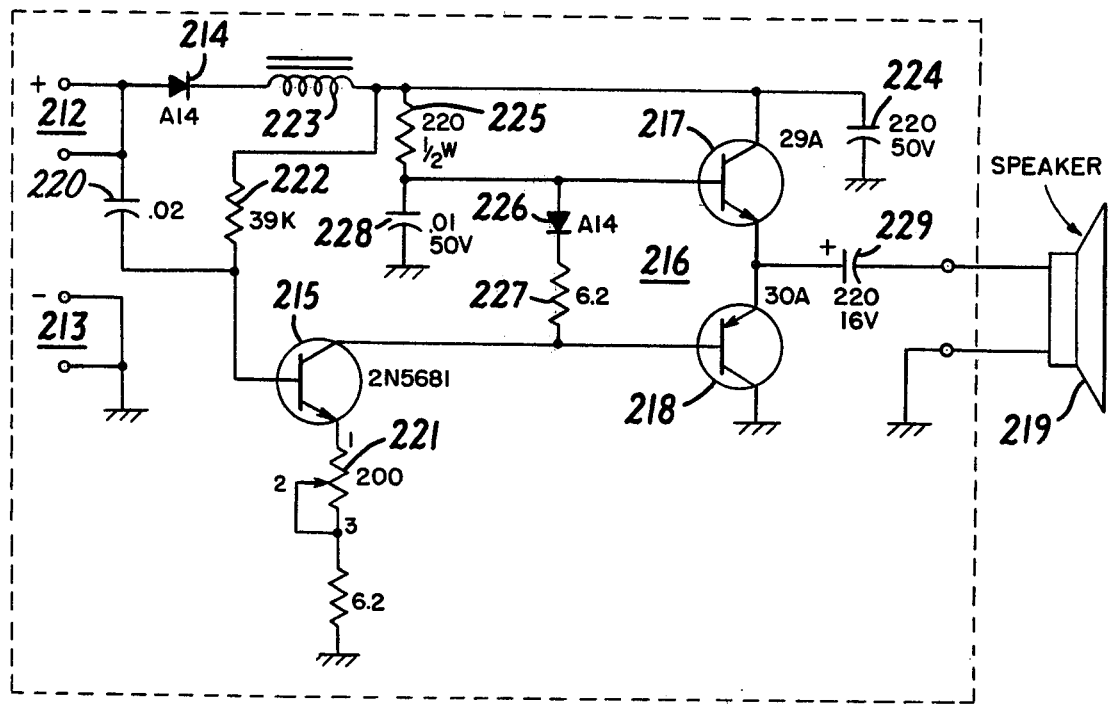
FIG. 4 is a detailed schematic view of another portion (one of the loudspeaker amplifiers) of the apparatus of FIG. 1.

The loudspeaker amplifier shown in FIG. 4 comprises a class A single-ended audio stage 215 direct-coupled to a class B push-pull output power stage 216. In the power-output stage, a transistor 217, which is NPN type, and a transistor 218, which is PNP type, are connected in a complementary-symmetry configuration. The circuit yields true push-pull operation without the use of phase inversion or transformers. The voice coil (not shown) of the speaker 219 is driven directly from the low-impedance emitters of transistors 217 and 218, thus eliminating the need for an output-matching transformer. The circuit uses a minimum of parts consistent with the desired degree of stability, freedom from distortion, frequency response and output power.

The gain of the amplifier and thus the output power is variable over a 20 dB range by adjustment of the value of the variable emitter resistance 221 of the transistor 215. The DC supply voltage is applied to the base resistor 222 of the transistor 215. The voltage drop across resistor 222, about 30 to 1, is used to bias the transistor 215 to the class A operating point. The audio signal voltage, which is superimposed on the DC voltage, is applied to the base of transistor 215 by means of capacitor 220, which at the same time blocks the DC voltage. Capacitor 220 thus serves the dual purpose of providing the proper signal level for transistor 215 and removing the DC component.

An inductor 223 and capacitor 224 form a low-pass filter that removes the signal component and allows application to the collectors of transistors 215, 217 and 218 of DC supply only, while providing enough impedance to develop an AC signal at the junction of the diode 214 and the capacitor 220. The operating Q point of the transistors 217 and 218 is set by the voltage drop across the collector resistor 225 of the class A driver transistor 215.

A diode 226 and a resistor 227 maintain a constant differential voltage on the bases of the transistors 217 and 218 to keep a small quiescent current flowing that reduces signal crossover distortion. A capacitor 228 establishes the high-frequency-response roll-off (-3 dB) point and suppresses high-frequency instability. A DC-blocking capacitor 229 provides a low-impedance output signal coupled to the voice coil of the loudspeaker 219.

Thus there is provided in accordance with the invention a novel and highly-effective automatic audible signaling system for use in emergency warning and direction of people in the evacuation of buildings and the like. Many modifications of the representative embodiments of the invention disclosed herein will readily suggest themselves to those skilled in the art upon consideration of this disclosure. Accordingly, the invention is not limited to the details of this disclosure but extends to all subject matter which is within the scope of the appended claims, and to equivalents thereof.

I claim:

1. In a loudspeaker amplifier having a signal input for an AC modulation signal which is amplified to produce an output signal driving a speaker, said amplifier having a power input for receiving DC power to operate said amplifier, the improvement comprising:
   means for receiving a mixed AC modulation and DC power signal;
   means for separating the AC modulation and the DC power from each other; and
   means for applying the separated AC modulation to said amplifier signal input and the separated DC power to said amplifier power input.

2. A loudspeaker amplifier according to claim 1 wherein said means for separating comprises:
   an inductor means for passing the DC signal and blocking the AC signal, said inductor means being connected in series between said means for receiving and said power input; and
   a capacitor means for passing the AC signal and blocking the DC signal, said capacitor means being connected in series between said means for receiving and said signal input.

3. A loudspeaker amplifier according to claim 2 further comprising an additional capacitor in series with said inductor and connected from said power input to ground for smoothing out any residual AC signal that might otherwise be mixed with the separated DC signal.

4. A loudspeaker amplifier according to claim 2 further comprising a diode connected in series with said inductor in said amplifier in such a manner that, when the DC signal is of one polarity, it is blocked by said diode and the amplifier is switched off, and, when the DC signal is of the opposite polarity, the separated DC and AC signals are effective to operate said amplifier.

* * * * *